United States Patent
Veres et al.

(10) Patent No.: US 7,029,945 B2
(45) Date of Patent: Apr. 18, 2006

(54) ORGANIC FIELD EFFECT TRANSISTOR WITH AN ORGANIC DIELECTRIC

(75) Inventors: Janos Veres, Manchester (GB); Simon Dominic Ogier, Manchester (GB); Soad Mohialdin-Khaffaf, Manchester (GB); Stephen William Leeming, Manchester (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 10/499,040

(22) PCT Filed: Nov. 21, 2002

(86) PCT No.: PCT/GB02/05248

§ 371 (c)(1),
(2), (4) Date: Jun. 17, 2004

(87) PCT Pub. No.: WO03/052841

PCT Pub. Date: Jun. 26, 2003

(65) Prior Publication Data

US 2005/0104058 A1 May 19, 2005

(30) Foreign Application Priority Data

Dec. 19, 2001 (GB) ............... 0130321.3
Dec. 20, 2001 (GB) ............... 0130451.8
Sep. 3, 2002 (GB) ............... 0220504.5

(51) Int. Cl.
*H01L 35/24* (2006.01)
*H01L 51/00* (2006.01)

(52) U.S. Cl. ............... 438/99; 257/40

(58) Field of Classification Search ............... None
See application file for complete search history.

(56) References Cited

U.S. PATENT DOCUMENTS

| 4,565,860 | A | 1/1986 | Murofushi et al. ......... 528/422 |
| 5,347,144 | A | 9/1994 | Garnier et al. ................ 257/40 |
| 5,546,889 | A | 8/1996 | Wakita et al. ................ 117/84 |
| 5,556,706 | A | 9/1996 | Wakita et al. ............. 428/421 |
| 5,612,228 | A | 3/1997 | Shieh et al. ................. 438/99 |
| 5,879,821 | A | 3/1999 | Hsieh ........................ 428/690 |
| 5,912,473 | A | 6/1999 | Wakita et al. ............... 257/40 |

(Continued)

FOREIGN PATENT DOCUMENTS

CN 1 348 222 5/2002

(Continued)

OTHER PUBLICATIONS

Dimitrakopoulos C D et al: "Field-effect transistors comprising molecular beam deposited alpha, omega-di-hexyl-hexathienylene and polymeric insulator" Synthetic Metals, 115 Jan. 1998, Elsevier, Switerland, vol. 92, No. 1, pp. 47-52, XP00149864 ISSN: 0379-6779.

(Continued)

*Primary Examiner*—Ngân V. Ngô
(74) *Attorney, Agent, or Firm*—Morgan, Lewis & Bockius LLP (57) ABSTRACT

A process of manufacturing an organic field effect device is provided comprising the steps of (a) depositing from a solution an organic semiconductor layer; and (b) depositing from a solution a layer of low permittivity insulating material forming at least a part of a gate insulator, such that the low permittivity insulating material is in contact with the organic semiconductor layer, wherein the low permittivity insulating material is of relative permittivity from 1.1 to below 3.0. In addition, an organic field effect device manufactured by the process is provided.

35 Claims, 3 Drawing Sheets

U.S. PATENT DOCUMENTS

| | | | |
|---|---|---|---|
| 5,981,970 A | 11/1999 | Dimitrakopoulos et al. | 257/40 |
| 6,100,954 A | 8/2000 | Kim et al. | 349/138 |
| 6,188,452 B1 | 2/2001 | Kim et al. | 349/43 |
| 6,204,515 B1 | 3/2001 | Bernius et al. | 257/40 |
| 2004/0038459 A1* | 2/2004 | Brown et al. | 438/142 |

FOREIGN PATENT DOCUMENTS

| | | |
|---|---|---|
| DE | 3610649 A1 | 10/1987 |
| EP | 0786820 | 7/1997 |
| JP | 7221367 | 8/1995 |
| WO | WO 97/33193 | 9/1997 |
| WO | 00/42668 | 7/2000 |
| WO | 00/79617 A1 | 12/2000 |
| WO | 01 20691 | 3/2001 |
| WO | WO 01/47043 A1 | 6/2001 |
| WO | WO 03/030278 A2 | 4/2003 |
| WO | WO 03/038921 A1 | 5/2003 |
| WO | WO 03/041185 A2 | 5/2003 |

OTHER PUBLICATIONS

Sheraw C D et al: "Spin-on polymer gate dielectric for high performance organic thin film transistors" Flat-Panel Displays and Sensors-Principles, Materials and Processes. Symposium (Material S Research Society Symposium Proceedings vol. 558), Flat-Panel Displays and Sensor-Principles, Materials and Processes, Symposium, San Francisco, CA, USA, 4-9, pp. 403-408, XP001149886 2000, Warrendale, PA, USA, Mater. Res. Soc, USA ISBN: 1-55899-465-3 the whole document.

Veres J et al: Air stable, amorphous Organic Films and their Applications to Solutions Processable Flexible Electronics, XP-001150353.

Mitzi D B et al: Organic-inorganic electronic devices based on hybrid perovskites XP-001149874.

Gundlach D J et al: "Improved Organic Thin Film Transistor Performance Using Chemically Modified Gate Dielectrics" XP-001149892.

Redecker et al., "High Mobility Hole Transport Fluorene-Triarylamine Copolymers", Adv. Mater., 11(3):241-246 (1999).

Tokito et al., "Thermal stability of electroluminescent devices fabricated using novel charge-transporting materials", Polymers Prep. (Am. Chem. Soc. Div. Polymer Chem.). 38(1):388-389 (1997).

Tanaka et al., "Novel hole-transporting materials based on triphenylamine for organic electroluminescent devices", Chem. Commun., pp. 2175-2176 (1996).

Tokito et al., "Thermal stability in oligomeric triphenylamine/tris(8-quinolinolato) aluminum electroluminescent devices", Appl. Phys. Lett., 70(15): 1929-1931 (Apr. 14, 1997).

Sheraw et al., "Spin-On Polymer Gate Dieletric for High-Performance Organic Thin Film Transistors", Mat. Res. Soc. Symp. Proc., 558:403-408 (2000).

Collet et al., "Low-voltage, 30 nm channel length, organic transistors with a self-assembled monolayer as gate insulating films", Applied Physics Letters, 76(14):1941-1943 (Apr. 3, 2000).

Wittman et al., "Highly oriented thin films of poly (tetrfluoroethylene) as a substrate for oriented growth of materials", Nature, 352:414-417 (Aug. 1, 1991).

* cited by examiner

ORGANIC FIELD EFFECT TRANSISTOR WITH AN ORGANIC DIELECTRIC

BACKGROUND OF THE INVENTION

This invention relates to organic field effect transistors (OFETS) and processes for their manufacture.

Field effect transistors (FET) based on inorganic materials such as Si are well established in the microelectronics industry. A typical FET consists of a number of layers and they can be configured in various ways. For example, an FET may comprise a substrate, an insulator, a semiconductor, source and drain electrodes connected to the semiconductor and a gate electrode adjacent the insulator. When a potential is applied on the gate electrode, charge carriers are accumulated in the semiconductor at its interface with the insulator. As a result, a conductive channel is formed between the source and the drain and a current will flow if a potential is applied to the drain.

In the past decade there has been growing interest in developing FETs using organic materials. Organic devices offer the advantage of structural flexibility, potentially much lower manufacturing costs and the possibility of low temperature ambient manufacturing processes on large areas. To take full advantage of organic circuits there is a need for materials and processes based on efficient coating methods to form various elements of an FET.

In order to achieve large current and fast switching, the semiconductor should have high carrier mobility. Thus significant effort has been concentrated on the development of organic semiconductor (OSC) materials with high mobilities. The progress of the development of organic semiconductor materials is well reviewed in the IBM Journal of Research & Development Vol. 45 No1. 2001. However, transistor performance is vastly affected by other components/materials used in an FET and also by the preparation conditions. Thus there is a need for improved materials, for example for use as gate insulators and for processes for preparing FETs reproducibly.

It is the purpose of the present invention to provide new and improved organic FETs and techniques to fabricate high quality organic transistors. It is also the purpose of the present invention to provide techniques to improve the semiconductor-insulator interface by the choice of materials and preparation conditions. In particular the present invention concerns the insulating material used in organic FETs.

The following prior art discloses gate insulators and processing techniques useful in organic semiconductors.

Gate insulators most widely used with organic FETs include inorganic and organic insulators with relatively high permittivities (i.e. relative permittivity, $\epsilon$, also called dielectric constant). For example $SiO_2$ ($\epsilon$~4) and $Al_2O_3$ ($\epsilon$~9–10), and organic insulators such as polyvinylphenol ($\epsilon$=3.5) have been used. Good results have been reported in conjunction with semiconductors such as evaporated pentacene, oligo- and polythiophenes where reported mobilities were in the order of 0.01–0.6 $cm^2V^{-1}s^{-1}$.

Much effort has been directed towards producing oriented organic semiconductor layers to improve mobilities. However, in order to achieve the orientation of the semiconductor layer, production processes have been used which are difficult and/or costly to apply to large areas, thus detracting from one of the potential advantages of OFETs, i.e. the possibility of solution coating the layers over large areas.

Wittmann and Smith (Nature 1991, 352, 414,) describe a technique of orienting organic materials on an oriented PTFE substrate. The PTFE is oriented by sliding a bar of solid PTFE on a hot substrate. This technique is applied in U.S. Pat. No. 5,912,473 (Matsushita, 1999, also U.S. Pat. No. 5,556,706 and U.S. Pat. No. 5,546,889) to use the PTFE oriented film as a substrate for depositing organic semiconductors in the manufacture of field effect transistors. The organic semiconductor also becomes oriented resulting in a higher carrier mobility. The PTFE layer is deposited according to the technique of Wittmann and Smith, i.e. sliding solid PTFE on the hot substrate. This orientation layer is not solution coated thus the technique is difficult to apply on large areas. In U.S. Pat. No. 5,546,889 (Matsushita, 1996) in particular, it describes a method of orienting organic films by the use of an alignment layer onto which the organic material is deposited. The alignment layer is provided by pressing a PTFE rod onto a hot surface and sliding it in one direction. In this way a thin oriented PTFE layer is deposited on a surface. One embodiment describes the deposition of the PTFE layer onto the insulator of an OFET prior to the deposition of the OSC. This method requires the substrate and insulator to be heated to unacceptably high temperatures (300° C.) and hence it is not preferred. In addition as the PTFE is not in solution form the method is difficult to apply on large areas. Finally, the invention does not provide any means for a top gate OFET via this technique.

JP7221367 (Matsushita, 1995) describes a technique for the orientation of thiophene oligomers by the use of an oriented polymer substrate. The polymer substrate can be a solution coated amorphous perfluoropolymer, which is rubbed to induce orientation. The document teaches the use of the perfluoropolymer as an alignment layer. For the gate insulator material the document suggests cyano ethyl pullulane, a cyano ethyl cellulose, polyvinyl alcohol, $SiO_2$, $Ta_2O_5$.

U.S. Pat. No. 5,612,228 (Motorola, 1997) claims complementary FET circuits with p-type organic and n-type inorganic materials. The n and p materials are deposited onto the same gate insulator using a bottom gate configuration. The organic semiconductor may be polyimide, polyphenylenevinylene, phthalocyanine, liquid crystal polymer or sexithiophene. It is suggested that the insulator may be "any convenient dielectric media such as $SiO_x$, $SiN_x$, $AlO_x$ as well as organic dielectric media such as polyimides, polyacrylates, poly(vinyl chloride), perfluoropolymers and liquid crystal polymers". The disclosure does not teach what polymer properties would be most important.

EP0786820 (Motorola, 1997) describes organic FETs with enhanced mobility by the use of orientation layers. For the orientation films rubbed polyimides, perfluoropolymers, and liquid crystal polymers are suggested. The invention suggests that the gate insulator may be "materials selected from inorganic dielectric media such as $SiO_x$, $SiN_x$ and $AlO_x$, as well as organic dielectric media such as polyimides, polyacrylates, poly(vinyl chloride), perfluoropolymers and liquid crystal polymers". The disclosure does not teach what polymer properties would be most important.

U.S. Pat. No. 6,100,954 (LG Electronics, 2000) and U.S. Pat. No. 6,188,452 (LG Electronics, 2001) suggest the use of organic insulators for both gate insulators and protective layers in LCD devices using polycrystalline silicon FET. The disclosure does not concern organic semiconductors.

Dimitrakopulous et al in Synthetic Metals 92, p47, 1998 describes vapour deposited $\alpha,\omega$-dihexathienylene (DH6T) transistors using vapour deposited Parylene-C, Nissan Polyimide 5211 or poly(methyl methacrylate) as insulator.

WO0147043 (Plastic Logic, 2001) describe organic FETs in which the gate insulator is polyvinylphenol (PVP), polyvinylalcohol (PVA), or polymethylmethacrylate (PMMA). The insulator is ink-jet printed from a solution of the material in a polar solvent to avoid dissolution or swelling of the underlying semiconductor. The document also describes organic FETs in which the gate insulator comprises more than one layer. In these cases non polar polymers are deposited between the polar insulator and PEDOT/

PSS conductive gate electrode to prevent the diffusion of ions through the polar gate insulator. Also, surface modification layers are used on top of the non-polar polymers to enhance the wetting of the PEDOT/PSS dispersion however, in all cases the insulator layer adjacent to the semiconductor is either PVP, PVA, or PMMA.

U.S. Pat. No. 6,204,5115B1 (Dow Chemical Company) disclose organic FETs based on copolymers of fluorene units. The document suggests a wide range of organic and inorganic insulators can be used provided they have a dielectric constant of at least 3.

Sheraw et al (Mat. Res. Soc. Symp. Proc. 2000, 58, 403) discloses evaporated pentacene FETs with benzocyclobutene (BCB), $SiO_2$, Parylene C and polyimide gate insulators. BCB has a dielectric constant of 2.65, and it can be solution deposited, but it requires curing at high temperatures (200° C.). This makes the process incompatible with plastic substrates such as polyethylenenaphthalate or polyetheneterephthalate and therefore is not preferred. Vapour deposition of the OSC is also not preferred as it is difficult to apply on large areas.

In order to reduce the operating voltage of FETs there has been a drive to use an insulator with a high dielectric constant. This is because the carrier density induced in the channel area is proportional to the permittivity according to: $p = V_g \in \in_0 d^{-1} e^{-1}$, where $V_g$ is the gate voltage, e is the electronic charge, $\in_0$ is the permittivity of vacuum, $\in$ is the relative permittivity (dielectric constant) of the insulator and d is the thickness of the insulator. High permittivity materials such as $TiO_2$ ($\in \sim 40-86$), $Ta_2O_5$ ($\in \sim 25$), $SrTiO_3$ ($\in \sim 150$) have been successfully used in inorganic FETs. These technologies are reviewed, by P. Balk in "Dielectrics for field effect technology" in Advanced Materials, Vol. 7, p703, 1995. In analogy to inorganic FETs, U.S. Pat. No. 5,981,970 (IBM, 1999) claims the use of high dielectric constant inorganic insulators for organic FETs. Examples are $PbZr_xTi_{1-x}O_3$ (PZT), $Bi_4Ti_3O_{12}$, $BaMgF_4$, barium zirconium titanate (BZT) and barium strontium titanate (BST). The insulators can be vacuum deposited or sol-gel spin-coated and subsequently annealed at 400–600° C. The invention teaches that a high permittivity material induces high charge density at low gate fields, which facilitates the filling of traps at the interface, thereby allowing the additional carriers to move easily without being hampered by the trapping process.

The use of high permittivity materials in organic transistors is further taught in the prior art (U.S. Pat. No. 6,207,472, IBM 2001; Dimitrakopoulos et al, Science 283, p822, 1999; Dimitrakopulos et al Adv. Mat. 11, p1372, 1999). For example, vapour deposited barium zirconate titanate (BZT, $\in=17.3$), barium strontium titanate (BST, $\in=16$) and $Si_3N_4$ ($\in=6.2$) were used with evaporated pentacene.

U.S. Pat. No. 5,347,144 (CNRS, 1994) claims organic insulators of high permittivity ($\in > 5$) as being advantageous for organic FETs. For example it is claimed that cyanoethylpullulane, which has a permittivity of 18.5, resulted in orders of magnitude higher mobility than $SiO_2$ or polyvinylalcohol insulators. The disclosure reports that no field effect could be obtained with low permittivity materials such as polymethylmethacrylate (PMMA, $\in=3.5$) or polystyrene ($\in=2.6$). The document attributes the result to the improved structural organisation of the organic semiconductor on a polar substrate.

DESCRIPTION OF THE INVENTION

Without wishing to be bound by a particular theory, we believe that polar groups of high permittivity insulators introduce random traps on localised states of the semiconductor through attraction of the charge carriers. Disordered or semi-disordered organic semiconductors, e.g. many organic semiconductors deposited by solution coating techniques, have a high density of localised states and electron or hole hopping is a limiting factor in charge transport. On the other hand, charge transport in, e.g. highly ordered, materials with mobilities close to 0.1 $cm^2$/V s begins to be reminiscent of band transport because such materials have a higher degree of ordering. Here, the random dipole fields of high permittivity insulators have much lower influence on an electronic band where carriers are delocalised over large distances. The prior art techniques solve interface trapping by using a high permittivity insulator to fill up interface traps easily by inducing high charge densities.

We have discovered that the use of insulators of low permittivity in the gate insulator layer solves the problem of interface trapping by eliminating the traps themselves and yields much better performance with organic semiconductors, particularly, but not exclusively, disordered or semi-disordered organic semiconductors. Since many solution coatable materials have some degree of disorder and localised states are present, there is a benefit in using certain low permittivity insulators to avoid the modulation of site energies by random dipole moments. It should be noted, however, that even with the best possible alignment processes available, organic semiconductors are still essentially disordered such that the use of low permittivity insulators may be beneficial. When using such materials we found that FETs could be fabricated of very high quality, reproducibility, field effect mobility and extremely low hysteresis normally caused by interface trapping. As a result, high quality transistors can be obtained with very low dependence of the mobility on gate field. Low permittivity materials lead to lower gate capacitance, reducing the number of induced carriers. However, it has only a linear effect on the drain current and is easily compensated for by the reduction in interface trapping with the potential to increase carrier mobility significantly.

According to a first aspect of the present invention there is provided a process of manufacturing an organic field effect device comprising the steps of a) depositing from a solution an organic semiconductor layer; and b) depositing from a solution a layer of low permittivity insulating material forming at least a part of a gate insulator, such that the low permittivity insulating material is in contact with the organic semiconductor layer, wherein the low permittivity insulating material is of relative permittivity from 1.1 to below 3.0.

According to a second aspect of the present invention there is provided an organic field effect device manufactured by the process of the first aspect of the invention.

BRIEF DISCRIPTION OF DRAWINGS

FIGS. 1a)–d) are cross sectional views of 4 possible configurations for a FET of the present invention. FIGS. 1a) and b) have a bottom gate configuration and FIGS. 1c) and d) have a top gate configuration.

FIGS. 2a)–d) are a cross-sectional views of 4 possible configurations of an FET of the present invention where two gate insulator layers are present. FIGS. 2a) and b) have a bottom gate configuration and FIGS. 2c) and d) have a top gate configuration.

In FIGS. 1a)–d) and 2a)–d) layer 1 is a substrate, layer 2 is an insulator, layer 3 is an organic semiconductor, S and D are source and drain electrodes and G is the gate electrode. In FIGS. 2a)–d) item 2a is a second insulator layer.

When a potential is applied on the gate electrode G, charge carriers are accumulated in the semiconductor at its interface with the insulator.

The invention may comprise depositing at least one high permittivity insulator layer on the other side of the low permittivity insulator layer from the organic semiconductor, to form a further part of the gate insulator. The at least one high permittivity insulator layer preferably has a higher permittivity than the low permittivity insulator layer. Preferably the at least one high permittivity insulator layer has a relative permittivity of 3.5 or higher, more preferably 10 or higher, and most preferably 20 or higher. The highest possible permittivity is preferred. The permittivity may range up to about 200. Preferably, the at least one high permittivity insulator layer is also deposited from a solution.

The organic semiconductor layer and/or the layer(s) of the gate insulator may be deposited from solution by spin coating.

The whole process of manufacturing the device may be performed at or below about 100° C., thus making the process much less difficult to carry out than prior art manufacturing processes.

Advantageously, since both the organic semiconductor layer and the gate insulator layer(s) are deposited from solution large areas can be coated readily. By using the low permittivity gate insulator layer it has been found that even if the organic semiconductor layer is disordered or semi-ordered good mobilities are achieved.

Preferably, the gate insulator layer comprises an organic material, e.g. a polymer.

Figure 1:
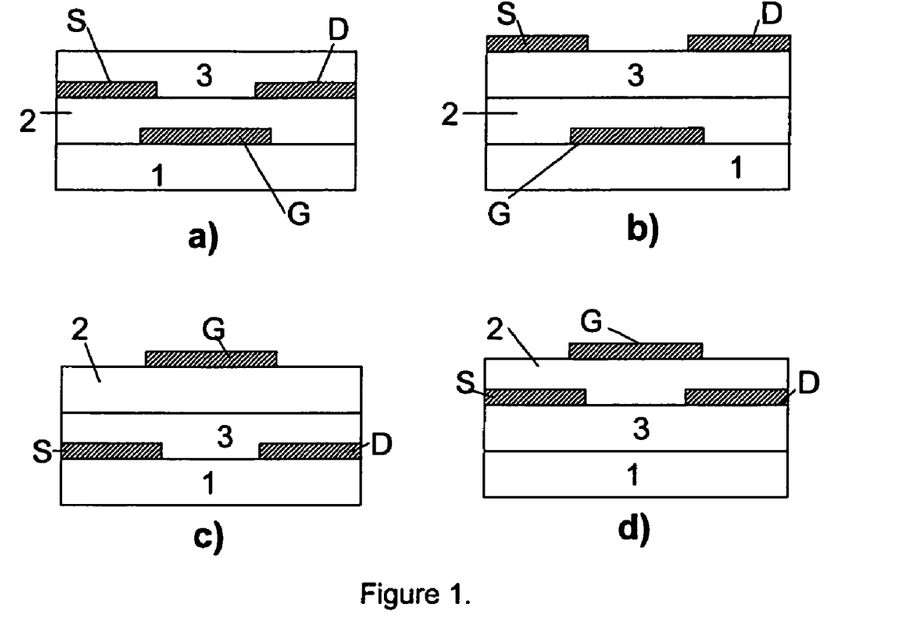

In one preferred embodiment an FET structure of FIG. 1c is prepared by spin coating the semiconductor onto the substrate with pre-patterned drain and source electrodes. Next, an insulator in the form of a low permittivity polymer of relative permittivity below 3 is spin coated onto the semiconductor followed by the deposition of the gate electrode by vacuum evaporation or liquid deposition of a conductive solution or dispersion. It will be appreciated that the order of process steps may be altered to achieve structures a, b or d shown in FIG. 1. It will be appreciated that the OFET could also have a vertical structure.

The low permittivity organic insulator should have a conductivity less than $10^{-6}$ Scm$^{-1}$ to avoid leakage to the gate. Preferred insulators are materials of low polarity. It is desirable that the low frequency (measured between 50 to 10,000 Hz) permittivity (dielectric constant) g of the material should be below 3.0, and preferably 1.1 or greater. The permittivity is more preferably in the range 1.3–2.5, and especially in the range 1.5 to 2.1. A further preferred lower limit on the permittivity is 1.7. Such materials have few permanent dipoles, which could otherwise enhance localisation of charges on molecular sites at the interface with the semiconductor. The permittivity (dielectric constant) can be determined by the ASTM D150 test method, Permittivity values of polymers may be found, for example, in the Handbook of Electrical and Electronic Insulating Materials (The Institute of Electrical and Electronic Engineers Inc., New York, 1995). It is desirable that the permittivity of the material has little dependence of frequency. This is typical of low or non-polar materials. Polymers and copolymers can be chosen by the permittivity of their substituent groups. The low permittivity material may be porous in order to achieve a very low permittivity. A list of low polarity polymers is given (without limiting to these examples) in Table 1:

TABLE 1

| Insulator | Typical low frequency permittivity (∈) |
|---|---|
| Fluorinated para-xylene | 2.4 |
| Fluoropolyarylether | 2.6 |
| Fluorinated polyimide | 2.7 |

TABLE 1-continued

| Insulator | Typical low frequency permittivity (∈) |
|---|---|
| Polystyrene | 2.5 |
| Poly (α-methyl styrene) | 2.6 |
| Poly (α-vinylnaphtalene) | 2.6 |
| Poly (vinyltoluene) | 2.6 |
| Polyethylene | 2.2–2.3 |
| cis-polybutadiene | 2.0 |
| Polypropylene | 2.2 |
| Polyisoprene | 2.3 |
| Poly (4-methyl-1-pentene) | 2.1 |
| Poly (tetrafluoroethylene) | 2.1 |
| Poly (chorotrifluoroethylene) | 2.3–2.8 |
| Poly (2-methyl-1, 3-butadiene) | 2.4 |
| Poly (p-xylylene) | 2.6 |
| Poly (α-α-α'-α' tetrafluoro-p-xylylene) | 2.4 |
| Poly [1,1-(2-methyl propane) bis (4-phenyl) carbonate] | 2.3 |
| Poly (cyclohexyl methacrylate) | 2.5 |
| Poly (chlorostyrene) | 2.6 |
| Poly (2,6-dimethyl-1,4-phenylene ether) | 2.6 |
| Polyisobutylene | 2.2 |
| Poly (vinyl cyclohexane) | 2.2 |
| Poly(arylene ether) | 2.6–2.8 |
| Polyphenylene | 2.6–2.7 |

The above list is non-exhaustive and other polymers could be used, including, for example, poly(4-methylstyrene), poly(1,3-butadiene) or polyphenylene. Copolymers containing the repeat units of the above polymers are also suitable. Copolymers offer the possibility of improving solubility, and continuity of the insulator layer.

It should be appreciated that in the above table certain materials are insoluble in commonly used solvents. If this is the case copolymers can be used. Some examples of copolymers are given in Table 2. Both random or block copolymers can be used. It is also possible to add some more polar monomer components as long as the overall composition remains low in polarity. Preferred low permittivity materials may, for example, be polypropylene, preferably amorphous polypropylene, or low permittivity fluoropolymers, for example copolymers of tetrafluoroethylene and dioxoles such as 2,2 bistrifluoromethyl-4,5-difluoro-1,3-dioxole available, for example from Aldrich or DuPont under the tradename Teflon AF or from Asahi Glass under the tradename CYTOP. The latter amorphous copolymers have been successfully used in microelectronics as interlayer insulators, where a low permittivity is required for reducing crosstalk between conductive tracks. Other preferred materials are low permittivity fluoropolymers, fluoroepoxy polymers, fluorosilane, fluoroacrylic polymers which are available, for example from Cytonix Corporation in the PFC GH, PFC GU, PFC MH product range, and poly(dimethyl) siloxane and its copolymers.

The polymer may optionally be cross-linked after coating by heat or radiation.

TABLE 2

| Insulator | Typical low frequency permittivity (∈) |
|---|---|
| Poly (ethylene/tetrafluoroethylene) | 2.6 |
| Poly (ethylene/chlorotrifluoroethylene) | 2.3 |
| Fluorinated ethylene/propylene copolymer | 2–2.5 |
| Polystyrene-co-α-methyl styrene | 2.5–2.6 |
| Ethylene/ethyl acrylate copolymer | 2.8 |
| Poly (styrene/10% butadiene) | 2.6 |
| Poly (styrene/15% butadiene) | 2.6 |
| Poly (styrene/2,4 dimethylstyrene) | 2.5 |

TABLE 2-continued

| Insulator | Typical low frequency permittivity ($\epsilon$) |
|---|---|
| Cytop | 2.0 |
| Teflon AF | 1.9–2.1 |
| Polypropylene-co-1-butene | 2.2 |

It is further preferred that in a top gate configuration (e.g. FIG. 1c,d) the low permittivity insulator is coated from a solvent which does not dissolve semiconductors typically used in organic FETs. Preferred solvents for the deposition of the gate insulator layer are fluorosolvents, preferably perfluorosolvents such as Fluorinert (trade name) FC40, FC75 (mainly consisting of perfluoro cyclic ethers), FC77 (mainly perfluorooctane) which are particularly suitable, resulting in sharp interface layers between the semiconductor and the insulator. Typical organic semiconductors such as oligo- and polythiophenes are virtually insoluble in perfluorosolvents. When a bottom gate configuration is used (e.g. FIG. 1a,b) the amorphous perfluoropolymers provide excellent chemical resistance against aromatic or chloro-solvents used to coat organic semiconductors.

A further advantage of the low permittivity materials is that they are hydrophopic and will provide a good barrier to water. Highly polar water molecules may introduce undesirable dipolar disorder at the semiconductor interface.

In order to define a sharp interface between a solution coated semiconductor and solution coated insulator, the prior art suggests alcohol soluble insulator materials such as polyvinylphenol (PVP). However, PVP is highly polar and hygroscopic; both properties being undesirable according to the present invention.

The organic semiconductor layer may be deposited before or after the gate insulator layer is deposited.

Figure 2:
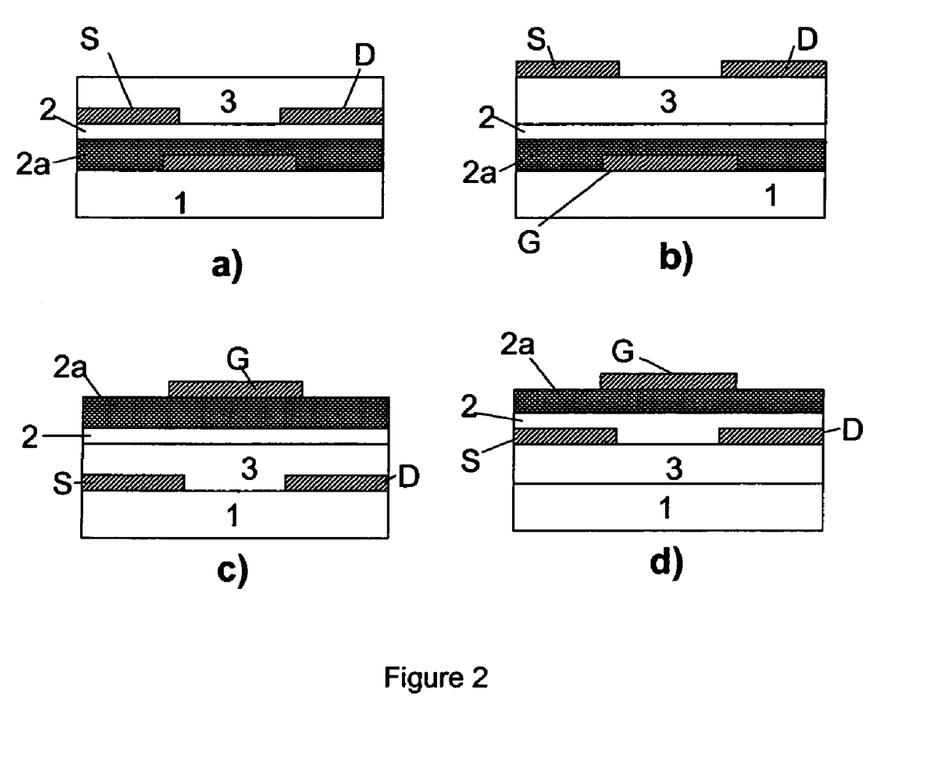

In a further embodiment of the invention the organic field effect transistor device of the invention comprises a further insulator layer, of permittivity higher than the low permittivity layer. The organic field effect transistor device of the invention may comprise two or more such further insulator layers. For example, as shown in FIG. 2, the low permittivity gate insulator layer 2 may be used in a thin layer next to the semiconductor and a second insulator layer 2a of higher permittivity next to the first insulator layer. The advantage of such configuration is that the first insulator layer of low polarity will screen the random dipole field of the second insulator material from the semiconductor. It is believed that in this embodiment the insulator layer 2 does not have to be much thicker than a few times the size of dipoles found in the second insulator material 2a. Thus a practical layer thickness for the first insulator layer 2 may be 5 nm or greater, up to 1 µm. The second insulator layer 2a of high permittivity may be of any thickness, for example 50 nm to 10 µm. It may be appreciated that further insulator layers can also be employed based on the idea of using a first layer of a thin, low permittivity material in contact with the semiconductor. The second layer preferably has a permittivity greater than 3.5 to maximise the gate capacitance. The second insulator layer more preferably has a permittivity greater than 10, even more preferably greater than 20, for example between 20 to 200 to maximise the gate capacitance. The further insulator layers may optionally be crosslinked. Polymers used in this layer may for example be polyinylalcohol, polyvinylphenol, polymethylmethacrylate, cyanoethylated polysaccharides such as cyanoethylpullulane, high permittivity flurorpolymers such as polyvinylidenefluoride, polyurethane polymers and poly(vinyl chloride/vinylacetate) polymers. The second insulator layer may be vapour deposited or deposited from solution, and is preferably deposited from solution. High permittivity composite materials are particularly useful as the second gate insulator layer, for example composites of $TiO_2$, $Ta_2O_5$, $SrTiO_3$, $Bi_4Ti_3O_{12}$, $BaMgF_4$, barium zirconium titanate, barium strontium titanate. These may be deposited preferably by liquid coating in the form of dispersions or by sol-gel processes. The combination of a low permittivity layer adjacent the organic semiconductor and further high permittivity layers in a multilayer gate insulator can reduce the operating voltage and at the same time eliminate interface trapping, hysteresis and increase mobility. In another embodiment, intermediate layers can be deposited between the low and high permittivity layers of a multilayer insulator stack. Such intermediate layers can improve adhesion or wetting between coating steps. The intermediate layer, for example can be another low permittivity material with different surface properties. Surface treatments, for example plasma treatment, may also be used to improve layer compatibility.

The organic semiconductor may be an n or p type, and is deposited from solution. Preferred organic semiconductors have a FET mobility of greater than $10^{-5}$ $cm^2V^{-1}$ $s^{-1}$.

The organic semiconductor may be any conjugated aromatic molecule containing at least three aromatic rings. Preferred organic semiconductors contain 5, 6 or 7 membered aromatic rings, especially preferred organic semiconductors contain 5 or 6 membered aromatic rings.

Each of the aromatic rings may optionally contain one or more hetero atoms selected from Se, Te, P, Si, B, As, N, O or S, preferably from N, O or S.

The rings may be optionally substituted with alkyl, alkoxy, polyalkoxy, thioalkyl, acyl, aryl or substituted aryl groups, a fluorine atom, a cyano group, a nitro group or an optionally substituted secondary or tertiary alkylamine or arylamine —$N(R^3)(R^4)$, where $R^3$ and $R^4$ each independently is H, optionally substituted alkyl, optionally substituted aryl, alkoxy or polyalkoxy groups. The alkyl and aryl groups may be optionally fluorinated.

The rings may be optionally fused or may be linked with a conjugated linking group such as —$C(T_1)$=$C(T_2)$—, —C≡C—, —N(R')—, —N=N—, (R')=N—, —N=C (R')—. $T_1$ and $T_2$ each independently represent H, Cl, F, —C≡N or lower alkyl groups particularly $C_{1-4}$ alkyl groups; R' represents H, optionally substituted alkyl or optionally substituted aryl. The alkyl and aryl groups may be optionally fluorinated.

Other organic semi-conducting materials that can be used in this invention include compounds, oligomers and derivatives of compounds of the following list:
conjugated hydrocarbon polymers such as polyacene, polyphenylene, poly(phenylene vinylene), polyfluorene including oligomers of those conjugated hydrocarbon polymers; condensed aromatic hydrocarbons such as anthracene, tetracene, chrysene, pentacene, pyrene, perylene, coronene; oligomeric para substituted phenylenes such as p-quaterphenyl (p-4P), p-quinquephenyl (p-5P), p-sexiphenyl (p-6P); conjugated heterocyclic polymers such as poly(3-substituted thiophene), poly(3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Preferred compounds are those from the above list and derivatives thereof which are soluble.

A preferred class of semiconductors has repeat units of formula 1:

Formula 1 where each $Y^1$ is independently selected from P, S, As, N and $Se_2$ and preferably polyarylamines, where $Y^1$ is N; $Ar^1$ and $Ar^2$ are aromatic groups and $Ar^3$ is present only if $Y^1$ is N, P, or As in which case it too is an aromatic group. $Ar^1$, $Ar^2$ and $Ar^3$ may be the same or different and represent, independently if in different repeat units, a multivalent (preferably bivalent) aromatic group (preferably mononuclear but optionally polynuclear) optionally substituted by at least one optionally substituted $C_{1-40}$ carbyl-derived groups and/or at least one other optional substituent, and $Ar^3$ represents, independently if in different repeat units, a mono or multivalent (preferably bivalent) aromatic group (preferably mononuclear but optionally polynuclear) optionally substituted by at least one: optionally substituted $C_{1-40}$ carbyl-derived group and/or at least one other optional substituent; where at least one terminal group is attached in the polymer to the $Ar^1$, $Ar^2$ and optionally $Ar^3$ groups located at the end of the polymer chains, so as to cap the polymer chains and prevent further polymer growth, and at least one terminal group is derived from at least one end capping reagent used in the polymerisation to form said polymeric material to control the molecular weight thereof.

WO 99/32537 and WO 00/78843 are patent applications of the applicants, which describes certain novel oligomers and polymers, which have repeat units of formula 1. The disclosures of these applications are incorporated herein by reference, as these materials are particularly useful as semiconductors in the present invention.

The number average degree of polymerisation is denoted by n and the number of the repeat units of Formula 1 which may be present per molecule in the invention may be from 2 to 1,000, preferably 3 to 100 and more preferably 3 to 20 inclusive. The polymer may comprise a mixture of different polymeric species of varying chain lengths and with a distribution of molecular weights (polydisperse) or consist of molecules of a single molecular weight (monodisperse).

The preferred polymeric materials are obtainable by polymerisation controlled by the addition of at least one end capping reagent in an amount sufficient to reduce substantially further growth of the polymer chain.

The asterisks extending from $Ar^1$ and $Ar^2$ in Formula 1 are intended to indicate that these groups may be multivalent (including divalent as shown in Formula 1).

The invention also relates to polymers further substituted with, on average, more than one aryl moiety which is further substituted with a moiety capable of chain extension or cross linking, for example by photopolymerisation or by thermal polymerisation. Such moieties capable of chain extension are preferably hydroxy, glycidyl ether, acrylate ester, epoxide, methacrylate ester, ethenyl, ethynyl, vinylbenzyloxy, maleimide, nadimide, trifluorovinyl ether, a cyclobutene bound to adjacent carbons on an aryl moiety or a trialkylsiloxy.

Other amine materials that may be useful in this invention are tetrakis(N,N'-aryl)biaryidiamines, bis(N,N'-[substituted] phenyl) bis(N,N'-phenyl)-1,1'-biphenyl-4,4'-diamines including 4-methyl, 2,4-dimethyl and/or 3-methyl derivatives thereof, tetrakis(N,N'-aryl)biphenyl-4,4'-diamine-1,1-cyclohexanes and their derivatives, triphenylamine and its alkyl and aryl derivatives and poly(N-phenyl-1,4-phenyleneamine), N-dibenzo[a,d]cycloheptene-5-ylidene-N',N'-di-p-tolyl-benzene-1,4-diamine, (9,9-dimethyl-9H-fluorene-2-yl)-di-p-tolyl-amine and their derivatives.

Further polyarylamine materials which may be useful in this invention have the following formulae:

TPTE

-continued

TPTR

TPPE

TPTE(S)

These molecules may be prepared directly via a multi-stage chemical synthesis which produces each molecule in a chemically pure monodisperse form.

Related materials, which may also find use in this invention have also been described in patent DE 3610649, EP 0669654-A (=U.S. Pat. No. 5,681,664), EP 0765106-A, WO 97-33193, WO 98-06773, U.S. Pat. No. 5,677,096 and U.S. Pat. No. 5,279,916.

Conjugated oligomeric and polymeric heterocyclic semiconductors may comprise a repeat unit of an optionally substituted 5 membered ring and terminal groups $A^1$ and $A^2$ as shown in Formula 2:

Formula 2 in which X may be Se, Te or preferably O, S, or —N(R)— where R represents H, optionally substituted alkyl or optionally substituted aryl; $R^1$, $R^2$, $A^1$ and $A^2$ may be independently H, alkyl, alkoxy, thioalkyl, acyl, aryl or substituted aryl, a fluorine atom, a cyano group, a nitro group or an optionally substituted secondary or tertiary alkylamine or arylamine —N($R^3$)($R^4$), where $R^3$ and $R^4$ are as defined above. The alkyl and aryl groups represented by $R^1$, $R^2$, $R^3$, $R^4$, $A^1$ and $A^2$ may be optionally fluorinated. The number of recurring units in the conjugated oligomer of Formula 2 is represented by an integer n, n is defined as for Formula 1. In compounds of Formula 2 n is preferably 2 to 14. Preferred oligomers have X=S, $R^1$ and $R^2$=H and $A^1$ and $A^2$=optionally substituted $C_{1-12}$ alkyl groups, examples of especially preferred compounds being $A^1$ and $A^2$=n-hexyl and where n=4, alpha-omega-n-hexylquaterthienylene (alpha-omega 4T), n=5, alpha-omega-n-hexylpentathienylene (alpha-omega-5T), n=6, alpha-omega-n-hexylhexathienylene (alpha-omega-6T), n=7, alpha-omega-n-hexylheptathienylene (alpha-omega-7T), n=8, alpha-omega-n-hexyloctathienylene (alpha-omega-8T), and n=9, alpha-omega-n-hexylnonathienylene (alpha-omega-9T). Oligomers containing a conjugated linking group may be represented by Formula 3:

Formula 3 in which X may be Se, Te, or preferably O, S, or —N(R)—, R is as defined above; $R^1$, $R^2$, $A^1$ and $A^2$ as defined above for Formula 2. Linking group L represents —C($T_1$)=C($T_2$)—, —C≡C—, —N(R')—, —N=N—, (R')=N—, —N=C(R')— with $T_1$ and $T_2$ defined as above.

Polymers may have repeat units of the general Formula 4:

Formula 4 in which X, $R^1$ and $R^2$ are defined as above. The sub units may be polymerised in such a way as to give a regio regular or a regio random polymer comprising repeat units as shown in Formulae 4 to 6:

Formula 4

Formula 5

Formula 6

Polymers may have repeat units of the general Formula 7:

Formula 7 in which X is as defined above and the bridging group A is optionally fluorinated $C_{1-6}$ alkyl, for example poly(3,4-ethylenedioxy)thiophene-2,5-diyl and poly(3,4-trimethyldioxy) thiophene-2,5-diyl.

Polymers may have repeat units of general Formula 8:

Formula 8 in which X, $R^1$ and $R^2$ are defined as above. Specific examples are where one of $R^1$ or $R^2$ is an alkoxide of general formula $C_nH_{2n+1}O-$, and the other of $R^1$ or $R^2$ is H, poly(dodecyloxy-α,α',-α,α" terthienyl) i.e. polyDOT$_3$.

Polymers may have repeat units of general Formula 9:

Formula 9 in which X is as defined above; $R^5$ and $R^6$ may be independently H, alkyl, aryl or substituted aryl. The alkyl and aryl groups may be optionally fluorinated.

Polymers may have repeat units of general Formula 10:

Formula 10 in which $R^7$ and $R^8$ are each independently optionally substituted $C_{1-20}$ hydrocarbyl, $C_{4-16}$ hydrocarbyl carbonyloxy, $C_{4-16}$ aryl(trialkylsiloxy) or both $R^7$ and $R^8$ may form with the 9-carbon on the fluorene ring a $C_{5-20}$ ring structure or a $C_{4-20}$ ring structure containing one or more heteroatoms of S, N or O.

Polymers may have repeat units of general Formula 11:

Formula 11 wherein $R^9$ is $C_{1-20}$ hydrocarbyl optionally substituted with di($C_{1-10}$alkyl)amino, $C_{1-20}$ hydrocarbyloxy or $C_{1-20}$ hydrocarbyl or tri($C_{1-10}$alkyl)siloxy.

Copolymers comprising repeat units as described above and also other repeat units comprising two or more of the repeat units could be used. Copolymers preferably comprise one or more repeat units of Formula 10 or Formula 11 and Formula 1. In a further preference copolymers comprise one or more repeat units of Formula 1 and one or more repeat units of at least one of Formulae 2 to 9. Preferred copolymers for use in the semiconductor layer include oligomers or polymers containing fluorene copolymerised with an arylamine or copolymerised with a thiophene.

In our copending patent application PCT/GB01/05145, the contents of which are incorporated herein by reference, we have described organic field effect transistors using solution coated compositions of an organic semiconductor and a binder polymer. The invention emphasised the need for low permittivity binder materials to reduce dipolar disorder. It is believed that the current invention using low permittivity solution coated gate insulators is particularly important for binder/semiconductor compositions claimed in PCT/GB01/05145. This is because dipolar disorder is to be avoided especially in the region where electronic transport takes place, i.e. at the insulator/semiconductor interface.

Where the semiconductor is a p type semiconductor this is preferably a monodisperse polyarylamine, mixtures of monodisperse polyarylamines, fluorine arylamine co-polymers, or cross-linkable arylamines.

Where the semiconductor is an n type semiconductor this is preferably a fluorophthalocyanines, or a substituted diaryl-1,4,5,8-naphthalenetetracarboxylic diimide and its oligomers.

The semiconducting channel may also be a composite of two or more of the same types of semiconductors. Furthermore, a p type channel material may, for example be mixed with n-type materials for the effect of doping the layer. Multilayer semiconductor layers may also be used. For example the semiconductor may be intrinsic near the insulator interface and a highly doped region can additionally be coated next to the intrinsic layer.

EXAMPLES

The invention is now described with reference to the following specific examples.

Preparation of Semiconductors

Example 1

Formula 12

This material was prepared using the procedure described in PCT/GB01/05145 to yield a yellow powder (7.8 g). $M_w=3700$.

Example 2

Formula 13

This material was prepared using the procedure described in PCT/GB01/05145 to yield a series of 13 fractions ranging from $M_w=700$ to $M_w=10000$.

Example 3

Formula 14

This material was prepared using the procedure described in WO 99/32537 to yield an off-white solid (20.2 g). ($M_w=3100$).

Example 4

Formula 15

This material was prepared using the procedure described in PCT/GB01/05145 to yield an orange solid Mw=17300.

Determination of the Field Effect Mobility

The field effect mobility of the materials was tested using the techniques described by Holland et al, J. Appl. Phys. Vol. 75, p. 7954 (1994).

In the following examples a test field effect transistor was manufactured by using a Melinex substrate upon which were patterned Pt/Pd source and drain electrodes by standard techniques, e.g. shadow masking. The semiconductor was dissolved one part into 99 parts of solvent, typically toluene, and spin coated onto the substrate at 1000 rpm for 20 s to yield a ~100 nm film. To ensure complete drying the sample was placed in an oven for 20 minutes at 100° C. A solution of the insulator material was then spin-coated onto the semiconductor giving a thickness typically in the range 0.5 µm to 1 µm. The sample was placed once more in an oven at 100° C. to evaporate solvent from the insulator. A gold gate contact was defined over the device channel area by evaporation through a shadow mask.

To determine the capacitance of the insulator layer a number of devices were prepared which consisted of a non-patterned Pt/Pd base layer, an insulator layer prepared in the same way as that on the FET device, and a top electrode of known geometry. The capacitance was measured using a hand-held multimeter, connected to the metal either side of the insulator. Other defining parameters of the transistor are the length of the drain and source electrodes facing each other (W=25 mm) and their distance from each other (L=100 μm).

The voltages applied to the transistor are relative to the potential of the source electrode. In the case of a p type gate material, when a negative potential is applied to the gate, positive charge carriers (holes) are accumulated in the semiconductor on the other side of the gate insulator. (For an n channel FET, positive voltages are applied). This is called the accumulation mode. The capacitance/area of the gate insulator $C_i$ determines the amount of the charge thus induced. When a negative potential $V_{DS}$ is applied to the drain, the accumulated carriers yield a source-drain current $I_{DS}$ which depends primarily on the density of accumulated carriers and, importantly, their mobility in the source-drain channel. Geometric factors such as the drain and source electrode configuration, size and distance also affect the current. Typically a range of gate and drain voltages are scanned during the study of the device. The source-drain current is described by equation 1.

$$I_{DS} = \frac{\mu W C_i}{L}\left((V_G - V_0)V_{DS} - \frac{V_{DS}^2}{2}\right) + I_\Omega, \quad \text{eq. 1}$$

where $V_0$ is an offset voltage and $I_\Omega$ is an ohmic current independent of the gate voltage and is due to the finite conductivity of the material. The other parameters have been described above.

For the electrical measurements the transistor sample was mounted in a sample holder. Microprobe connections were made to the gate, drain and source electrodes using Karl Suss PH100 miniature probe-heads. These were linked to a Hewlett-Packard 4155B parameter analyser. The drain voltage was set to –20 V and the gate voltage was scanned from +20 to –40 V in 1 V steps. When $|V_G|>|V_{DS}|$ the source-drain current varies linearly with $V_G$. Thus the field effect mobility can be calculated from the gradient of $I_{DS}$ vs. $V_G$ given by equation 2.

$$S = \frac{\mu W C_i V_{DS}}{L} \quad \text{eq. 2}$$

All field effect mobilities quoted below were calculated from this regime (unless stated otherwise).

The following examples describe the results obtained with inventive and prior art gate insulators used in OFETs. The performance of various devices is compared in Table 1 together with the permittivity of the appropriate insulator. The device preparation and test method is described in the previous section and was the same for all the examples (unless stated otherwise). Examples 28–33 describe multilayer devices, i.e. with additional insulator layers, and the results are summarised in Table 2 below.

Examples 5–6

OFETs were prepared using organic semiconductor of Formula 12 (Example 5) and Formula 13 (Example 6). A low permittivity perfluoropolymer, Cytop107M (Asahi Glass, Z-1700E01) was used to form the gate insulator. The insulator was spin coated from a 1:1 mixture with FC75 solvent (Acros 12380-0100). The devices yielded very low hysteresis and threshold voltage. In addition the mobility did not vary with applied gate bias when $V_G$ was more negative than $V_D$. The mobilities obtained are shown in Table 1, together with all the mobilities obtained in the following examples.

Example 7

An OFET was prepared using OSC of Formula 13. A low permittivity perfluoropolymer, Teflon AF1600 (Aldrich, 46,961-0) was used to form the gate insulator. The insulator was spin coated from a 25:1 mixture with FC40 solvent (Acros 12376-0100). The device yielded very low hysteresis and threshold voltage. In addition the mobility did not vary with applied gate bias when $V_G$ was more negative than $V_D$.

Example 8

An OFET was prepared and tested as described in Example 5 except using OSC of Formula 14. The device yielded very low hysteresis and threshold voltage. In addition the mobility did not vary with applied gate bias when $V_G$ was more negative than $V_D$.

Example 9

(Comparative)

An OFET was prepared using OSC of Formula 14. A prior art polar polymer, polymethylmethacrylate (Aldrich 18,226-5) was used to form the gate insulator. The insulator was spin coated from a 12.5:1 mixture with acetone. The device exhibited hysteresis and a dependence of the mobility upon applied gate bias.

Example 10

(Comparative)

An OFET was prepared using an OSC of Formula 14. A prior art polar polymer, poly4-vinyl-phenol (Aldrich 43,622-4) was used to form the gate insulator. The insulator was spin coated from a 10:1 (w/w) solution in methanol. The device exhibited hysteresis and a dependence of the mobility upon applied gate bias.

Example 11

(Comparative)

An OFET was prepared using OSC of Formula 14 on predefined source and drain electrodes on a thermally oxidised silicon substrate as described in PCT/GB01/05145. The 200 nm $SiO_2$ layer served as the gate insulator. Such $SiO_2$ gate insulators are widely used in the prior art. The device exhibited hysteresis and a strong dependence of the mobility upon applied gate bias.

Example 12

An OFET was prepared and tested as described in Example 6 except the OSC was deposited from anisol. The device yielded very low hysteresis and threshold voltage.

Example 13

(Comparative)

An OFET was prepared using an OSC of Formula 14. A prior art polar polymer, polycyanopulluane (CYMM) (ShinEtsu) was used to form the gate insulator. The insulator was spin coated from a 10% (w/w) solution in acetone. The device exhibited very strong hysteresis and a significant dependence of the mobility upon applied gate bias. The difference in threshold voltage between scanning the voltage on the gate in the direction +20V to −40V compared with −40V to +20V was approximately 5V.

Example 14

(Comparative)

An OFET was prepared and tested as described in Example 13 except the OSC layer was washed with acetone prior depositing the insulator. By washing off any semiconductor polymer fraction that may be soluble in acetone we aimed at reducing intermixing between the OSC layer and the CYMM insulator layer. However, this has not improved the mobility compared to Example 13.

Example 15

An OFET was prepared using an OSC of Formula 14. A low permittivity polymer, polyisobutylene (PIB) (Aldrich, 18,145-5) was used to form the gate insulator. The insulator was spin coated from a 3% (w/w) solution in hexane. The device yielded very low hysteresis and threshold voltage.

Example 16

An OFET was prepared using an OSC of Formula 13. A low permittivity polymer, polyisobutylene (PIB) (Aldrich, 18,145-5) was used to form the gate insulator. The insulator was spin coated from a 3% (w/w) solution in hexane. The device yielded very low hysteresis and threshold voltage.

Example 17

An OFET was using an OSC of Formula 14. A low permittivity polymer, polyisobutyl-methacrylate (PIBMMA) (Aldrich, 44,576-2) was used to form the gate insulator. The insulator was spin coated from a 10% (w/w) solution in isopropanol. The device yielded very low hysteresis and threshold voltage.

Example 18

(Comparative)

An OFET was prepared using an OSC of Formula 14. A polar polymer, poly(4-vinylphenol-co-methyl methacrylate) (PVPMMA) (Aldrich, 47,457-6) was used to form the gate insulator. The insulator was spin coated from a 15% (w/w) solution in ethanol.

Example 19

An OFET was prepared using an OSC of Formula 14. A low permittivity perfluoropolymer, Teflon AF2400 (Aldrich, 46,962-9) was used to form the gate insulator. The insulator was spin coated from a 1.5% (w/w) mixture with FC75 solvent. The device yielded very low hysteresis and threshold voltage.

Example 20

(Comparative)

An OFET was prepared using OSC of Formula 14. The polymer polyvinylchloride (PVC) (Aldrich, 18,958-8) was used to form the gate insulator. The insulator was spin coated from a 2.5% (w/w) solution in tetrachloroethane onto an aluminised piece of mylar to form a bottom gate structure. The OSC (of formula 14) was spin coated on top of the insulator and source-drain electrodes were deposited by the thermal evaporation of gold through a shadow mask on top of the OSC.

Example 21

An OFET was prepared using an OSC of Formula 14 mixed with a binder polymer poly(alpha-methylstyrene) (Aldrich, 19,184-1) at 3:1 ratio (w/w). A low permittivity perfluoropolymer, Cytop809A (Asahi Glass) was used to form the gate insulator. The insulator was spin coated from a 1:1 mixture (w/w) with FC75 solvent. The device yielded very low hysteresis and threshold voltage.

Example 22

(Comparative)

An OFET was prepared with the same semiconductor/binder layer as in Example 20, but using prior art SiO2 as the insulator, as described in Example 10. The semiconductor yielded lower mobility and stronger hysteresis than in Example 20. The device exhibited hysteresis and a dependence of the mobility upon applied gate bias.

Example 23

An OFET was prepared and tested as described in Example 3 using OSC of Formula 14. A low permittivity fluoropolymer, CYTONIX PFC2050 (Cytonix corp.) was used to form the gate insulator. The insulator was spin coated from a 14% (w/w) solution using FC75 as a solvent. The device yielded very low hysteresis and threshold voltage.

Example 24

(Comparative)

An OFET was prepared using an OSC of Formula 14. A high permittivity polymer (poly vinyl alcohol) (Aldrich, 36,316-2) was used to form the gate insulator. The insulator was spin coated from a 4% (w/w) solution in water. The device exhibited hysteresis and a dependence of the mobility upon applied gate bias.

Example 25

An OFET was prepared and tested as described in Example 3 using OSC of Formula 14. A low permittivity polymer, poly (propylene-co-1-butene) (Aldrich 43,108-7) was used to form the gate insulator. The insulator was spin coated from a 2% (w/w) solution in cyclohexane (warmed to dissolve polymer). The device yielded very low hysteresis and threshold voltage.

Example 26

OFETs were prepared using organic semiconductor of Formula 15. A low permittivity perfluoropolymer, Cytop107M (Asahi Glass, Z-1700E01) was used to form the gate insulator. The insulator was spin coated from a 1:1 mixture with FC75 solvent (Acros 12380-0100). The devices yielded very low hysteresis and threshold voltage.

Example 27

(Comparative)

An OFET was prepared using OSC of Formula 15. A prior art polar polymer, polymethylmethacrylate (Aldrich 18,226-5) was used to form the gate insulator. The insulator was spin coated from a 12.5:1 mixture with acetone. The device exhibited hysteresis and a dependence of the mobility upon applied gate bias.

Example 28

An OFET was prepared using an OSC of Formula 14. Three dielectric layers were used to form the gate insulator. The first layer (adjacent to the OSC) was a low permittivity perfluoropolymer, Cytop107M (Asahi Glass, Z-1700E01). This was spin coated from a 1:1 mixture with FC75 solvent. The second layer, polyisobutylene (PIB) (Aldrich, 18,145-5), was spin coated from a 3% (w/w) solution in hexane. The third layer, polycyanopulluane (CYMM) (ShinEtsu), was spin coated from a 5% (w/w) solution in acetone. The device yielded very low hysteresis and threshold voltage. Results for the multi-layer insulators are summarised in table 2.

Example 29

An OFET was prepared using an OSC of Formula 13 in anisole. Two dielectric layers were used to form the gate insulator. The first layer (adjacent to the OSC) was a low permittivity polymer polyisobutylene (PIB) (Aldrich, 18,145-5), spun from a 3% (w/w) solution in hexane. The second layer, polycyanopulluane (CYMM) (ShinEtsu), was spin coated from a 10% (w/w) solution in acetone. The device yielded very low hysteresis and threshold voltage but achieved a much higher on current than using the PIB alone due to the higher overall capacitance of the PIB/CYMM stack.

Example 30

An OFET was prepared using an OSC of Formula 13. Two dielectric layers were used to form the gate insulator. The first layer (adjacent to the OSC) was a low permittivity polymer polypropylene (Aldrich, 42,818-3) spun from a 1% (w/w) solution in hexane. The second layer, polycyanopulluane (CYMM) (ShinEtsu), was spin coated from a 10% (w/w) solution in acetone.

Example 31

An OFET was prepared using an OSC of Formula 14. Two dielectric layers were used to form the gate insulator. The first layer (adjacent to the OSC) was a low permittivity perfluoropolymer, Cytop107M (Asahi Glass, Z-1700E01). This was spin coated from a 1% (w/w) solution in FC75 solvent. The sample was subjected to an air plasma for 5 minutes to make the surface more hydrophilic. The second layer, polycyanopulluane (CYMM) (ShinEtsu), was spin coated from a 10% (w/w) solution in acetone. The device yielded very low hysteresis and threshold voltage.

Example 32

An OFET was prepared using an OSC of Formula 14. Three dielectric layers were used to form the gate insulator. The first layer (adjacent to the OSC) was a low permittivity perfluoropolymer, Cytop107M (Asahi Glass, Z-1700E01). This was spin coated from a 1:1 mixture with FC75 solvent. The second layer, polypropylene (PP) (Aldrich, 42,818-3), was spin coated from a saturated solution in toluene. The third layer, poly vinylidine fluoride (PVDF) (Aldrich 42,715-2), was spin coated from a 5% (w/w) solution in NMP (N-Methylpyrrolidone). The device yielded very low hysteresis and threshold voltage.

Example 33

An OFET was prepared using an OSC of Formula 14. Three dielectric layers were used to form the gate insulator. The first layer (adjacent to the OSC) was a low permittivity perfluoropolymer, Teflon AF1600 (Aldrich, 46,961-0). This was spin coated from a 3% (w/w) solution in FC75 solvent. The second layer, polypropylene (PP) (Aldrich, 42,818-3), was spin coated from a saturated solution in toluene. The third layer, poly vinylidine fluoride (PVDF) (Aldrich 42,715-2), was spin coated from a 5% (w/w) solution in NMP. The device yielded very low hysteresis and threshold voltage.

Graph of Mobility Vs. Permittivity

Figure 3:
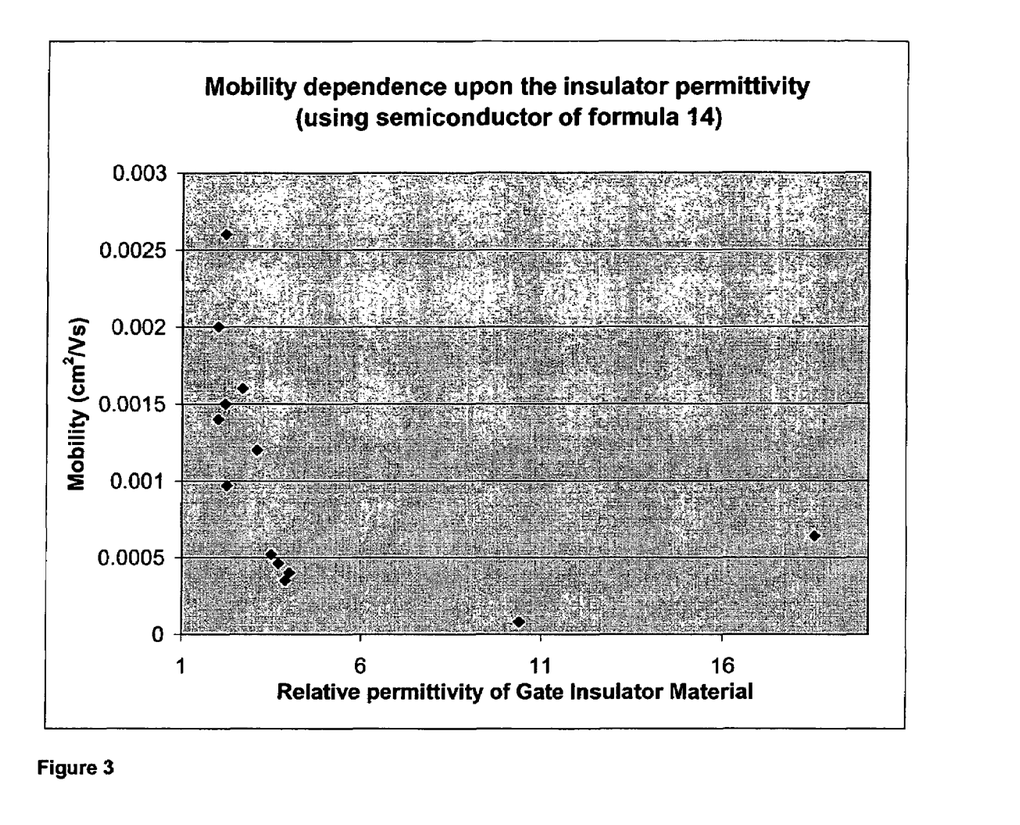

The graph shown in FIG. 3 shows the mobility dependence upon the dielectric permittivity. This highlights our preference for choosing dielectrics with a permittivity of between 1.1 and 3.0 for the insulator next to the semiconductor.

TABLE 1

Summary of FET devices prepared using single-layer insulators:

| Example | OSC | Insulator layer | Permittivity, $\epsilon$, of Insulator | Mobility $[cm^2V^{-1}s^{-1}]$ |
|---|---|---|---|---|
| 5 | 12 | Cytop107M | 2.0 | $2.0 \times 10^{-3}$ |
| 6 | 13 | Cytop107M | 2.0 | $4.0 \times 10^{-3}$ |
| 7 | 13 | Teflon AF1600 | 1.9–2.1 | $2.2 \times 10^{-3}$ |
| 8 | 14 | Cytop107M | 2.0 | $2.0 \times 10^{-3}$ |
| 9 (Comparative) | 14 | PMMA | 4.0 | $4.0 \times 10^{-4}$ |
| 10 (Comparative) | 14 | PVP | 3.5 | $5.2 \times 10^{-4}$ |
| 11 (Comparative) | 14 | $SiO_2$ | 3.9 | $3.5 \times 10^{-4}$ |

TABLE 1-continued

Summary of FET devices prepared using single-layer insulators:

| Example | OSC | Insulator layer | Permittivity, $\epsilon$, of Insulator | Mobility $[cm^2V^{-1}s^{-1}]$ |
|---|---|---|---|---|
| 12 | 13 | Cytop107M | 2.0 | $6.3 \times 10^{-3}$ |
| 13 (Comparative) | 14 | CYMM (2000 nm) | 18.5 | $6.4 \times 10^{-4}$ |
| 14 (Comparative) | 14 | CYMM (2000 nm) | 18.5 | $4.1 \times 10^{-4}$ |
| 15 | 14 | PIB | 2.2 | $2.6 \times 10^{-3}$ |
| 16 | 13 | PIB | 2.2 | $6.1 \times 10^{-3}$ |
| 17 | 14 | PIBMMA | 2.68 | $1.6 \times 10^{-3}$ |
| 18 (Comparative) | 14 | PVPMMA | ~3.5–4 | $4.6 \times 10^{-4}$ |
| 19 | 14 | Teflon AF 2400 | 1.9–2.1 | $1.4 \times 10^{-3}$ |
| 20 (Comparative) | 14 | PVC | 3.1 | $1.2 \times 10^{-3}$ |
| 21 | 14 in binder | Cytop 809A | 2.0 | $8 \times 10^{-4}$ |
| 22 (Comparative) | 14 in binder | $SiO_2$ (200 nm) | 3.9 | $1.1 \times 10^{-4}$ |
| 23 | 14 | Cytonix PFC2050 | 2.25 | $9.7 \times 10^{-4}$ |
| 24 (Comparative) | 14 | PVA | 10.4 | $8.0 \times 10^{-5}$ |
| 25 | 14 | PP-co-butene | 2.2 | $1.5 \times 10^{-3}$ |
| 26 | 15 | Cytop107M | 2.0 | $1.7 \times 10^{-3}$ |
| 27 (Comparative) | 15 | PMMA | 4.0 | $3.3 \times 10^{-4}$ |

TABLE 2

Summary of FET devices prepared using multi-layer insulators

| Example | OSC | First insulator layer | $\epsilon$ | Further insulator layers | $\epsilon_2, \epsilon_3 \ldots$ | Mobility $[cm^2V^{-1}s^{-1}]$ |
|---|---|---|---|---|---|---|
| 28 | 14 | Cytop107M (500 nm) | 2.0 | PIB (350 nm) CYMM (1000 nm) | 2.1 18.5 | $1.4 \times 10^{-3}$ |
| 29 | 13 | PIB (350 nm) | 2.1 | CYMM (2000 nm) | 18.5 | $1.0 \times 10^{-2}$ |
| 30 | 13 | PP (27 nm) | | CYMM (2000 nm) | 18.5 | $8.6 \times 10^{-3}$ |
| 31 | 14 | CYTOP 107M (200 nm) | 2.0 | CYMM (2000 nm) | 18.5 | $2.6 \times 10^{-3}$ |
| 32 | 14 | CYTOP 107M (500 nm) | 2.0 | PP (~30 nm) PVDF (300 nm) | 2.2 7.5 | $3 \times 10^{-3}$ |
| 33 | 14 | TEFLON AF 2400 (460 nm) | 19–2.1 | PP (~30 nm) PVDF (300 nm) | 2.2 7.5 | $1.9 \times 10^{-3}$ |

Figure 4:
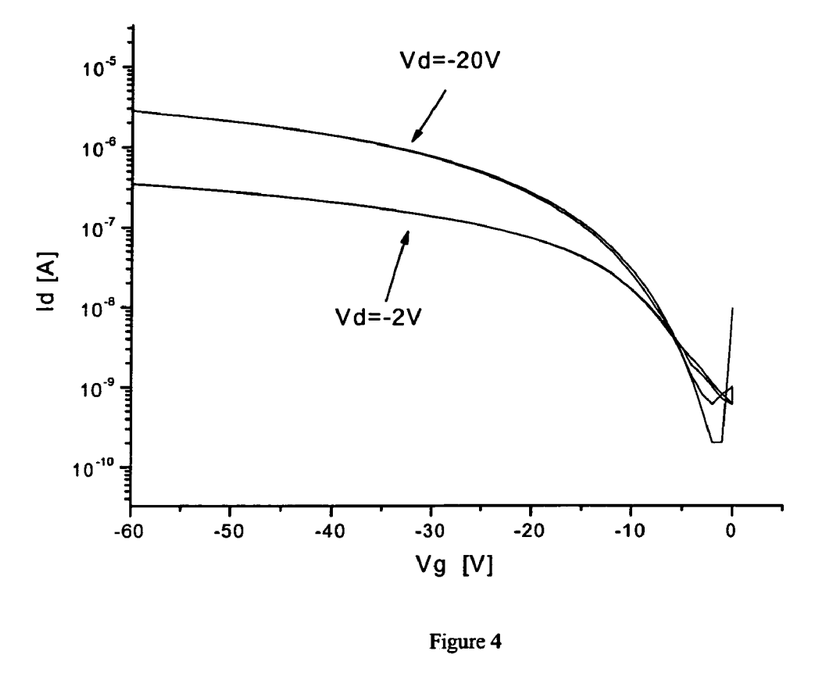
Figure 5:
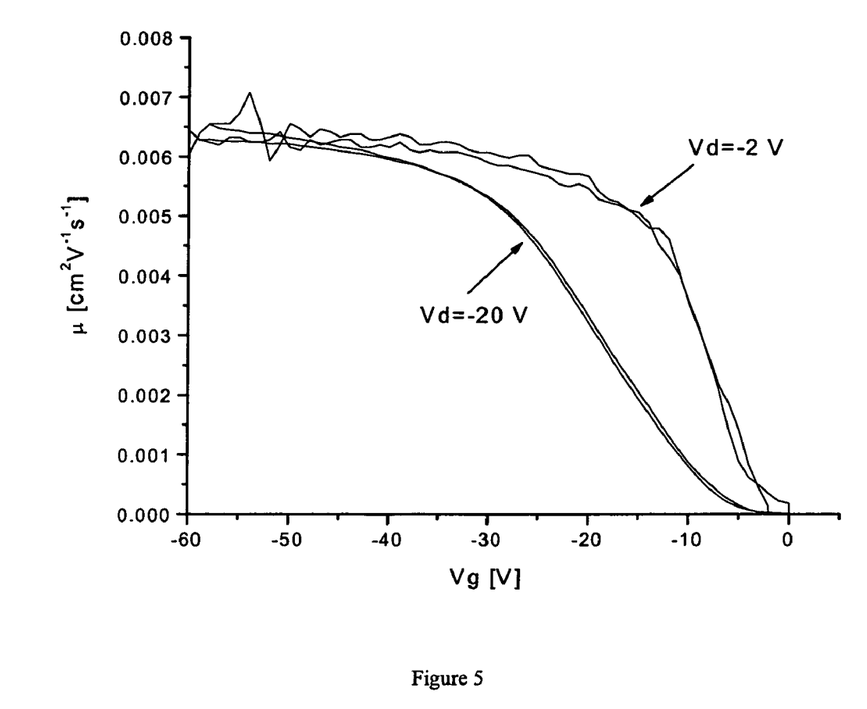

FIG. 4 illustrates the transfer characteristics of the OFET of Example 12 at two drain voltages, Vd=−2V and Vd=−20V. FIG. 5 illustrates the mobility calculated from the transfer curve of FIG. 4 according to Equation 2. This mobility calculation is accurate when Vg is much greater than Vd. It can be seen that for this condition the mobility is fairly independent of the gate voltages.

The invention claimed is:

1. A process of manufacturing an organic field effect device comprising the steps of
   a) depositing from a solution an organic semiconductor layer; and
   b) depositing from a solution a layer of low permittivity insulating material forming at least a part of a gate insulator, such that the low permittivity insulating material is in contact with the organic semiconductor layer, wherein the low permittivity insulating material is of relative permittivity from 1.1 to below 3.0 with the proviso that the low permittivity insulating material is not benzocyclobutene (BCB).

2. A process as claimed in claim 1 further comprising depositing on the other side of the layer of low permittivity insulating material from the organic semiconductor layer at least one layer of high permittivity insulating material, wherein the high permittivity insulating material is of relative permittivity higher than the low permittivity insulating material.

3. A process as claimed in claim 2 wherein the at least one layer of high permittivity insulating material is deposited from a solution.

4. A process as claimed in claim 1 wherein one or more of the layers is deposited from a solution comprising a fluoro solvent.

5. A process as claimed in claim 1 wherein one or more of the layers is deposited from solution by spin coating.

6. A process as claimed in claim 1 wherein all steps are performed at or below about 100° C.

7. An organic field effect device manufactured by the process as claimed in claim 1.

8. An organic field effect device as claimed in claim 7 wherein the permittivity of the low permittivity insulating material is in the range 1.3 to 2.5, preferably in the range 1.5 to 2.1.

9. An organic field effect device as claimed in claim 7 wherein the device has a top gate configuration.

10. An organic field effect device as claimed in claim 7 wherein the device has a bottom gate configuration.

11. An organic field effect device as claimed in claim 7 wherein the high permittivity insulating material has a permittivity greater than 3.5, preferably greater than 10, more preferably greater than 20, and up to 200.

12. An organic field effect device as claimed in claim 11 wherein the high permittivity insulating material comprises polyvinylidene fluoride, cyanopulluane, polyvinylalcohol or other highly polar organic polymer.

13. An organic field effect device as claimed in claim 11 wherein the high permittivity insulating material comprises at least one of TiO2, $Ta_2O_5$, $SrTiO_3$, $Bi_4Ti_3O_{12}$, $BaMgF_4$, barium zirconium titanate, barium strontium titanate or other highly polar inorganic material.

14. An organic field effect device as claimed in claim 7 wherein the thickness for the low permittivity insulating material layer is in the range 5 nm to 1 □m and the thickness of the at least one high permittivity insulating material layer is in the range 50 nm to 10 □m.

15. An organic field effect device as claimed in claim 7 wherein the gate insulator layer comprises an organic material.

16. An organic field effect device as claimed in claim 15 wherein the low permittivity insulating material layer comprises a fluoropolymer.

17. An organic field effect device as claimed in claim 15 wherein the low permittivity insulating material layer comprises a polyethylene, polypropylene, polyisobutylene, poly(4 methyl 1-pentene), polyisoprene, poly(vinyl cyclohexane) or a copolymer containing the monomer units of at least one of these materials.

18. An organic field effect device as claimed in claim 15 wherein the low permittivity insulating material layer comprises copolymers of tetrafluoroethylene and dioxoles.

19. An organic field effect device as claimed in claim 7 wherein the organic semiconductor layer has a mobility greater than $10^{-5}$ $cm^2V^{-1}s^{-1}$.

20. An organic field effect device as claimed in claim 19 wherein the organic semiconductor layer comprises a polyarylamine.

21. An organic field effect device as claimed in claim 20 wherein the organic semiconductor layer contains a monodisperse arylamine compound with a number of repeat units, n, $\geq 2$.

22. An organic field effect device as claimed in claim 19 wherein the organic semiconductor layer comprises an oligomer or polymer containing fluorene copolymerised with an arylamine.

23. An organic field effect device as claimed in claim 19 wherein the organic semiconductor layer comprises an oligomer or polymer containing a thiophene.

24. An organic field effect device as claimed in claim 19 wherein the organic semiconductor layer comprises an oligomer or polymer containing fluorene copolymerised with a thiophene.

25. An organic field effect device as claimed in claim 19 wherein the organic semiconductor layer comprises a composite of at least two organic semiconductor species.

26. An organic field effect device as claimed in claim 19 wherein the organic semiconductor layer includes a binder polymer.

27. A process as claimed in claim 1 wherein the permittivity of the low permittivity insulating material is in the range 1.3 to 2.5.

28. A process as claimed in claim 2 wherein the high permittivity insulating material has a permittivity greater than 3.5 and up to 200.

29. A process as claimed in claim 28 wherein the high permittivity insulating material comprises polyvinylidene fluoride, cyanopulluane, polyvinylalcohol or other highly polar organic polymer.

30. A process as claimed in claim 28 wherein the high permittivity insulating material comprises at least one of TiO2, $Ta_2O_5$, $SrTiO_3$, $Bi_4Ti_3O_{12}$, $BaMgF_4$, barium zirconium titanate, barium strontium titanate or other highly polar inorganic material.

31. A process as claimed in claim 28 wherein the thickness for the low permittivity insulating material layer is in the range 5 nm to 1 □m and the thickness of the at least one high permittivity insulating material layer is in the range 50 nm to 10 □m.

32. A process as claimed in claim 27 wherein the low permittivity insulating material layer comprises a fluoropolymer.

33. A process as claimed in claim 32 wherein the low permittivity insulating material layer comprises a polyethylene, polypropylene, polyisobutylene, poly(4 methyl 1-pentene), polyisoprene, poly(vinyl cyclohexane) or a copolymer containing the monomer units of at least one of these materials.

34. A process as claimed in claim 33 wherein the low permittivity insulating material layer comprises copolymers of tetrafluoroethylene and dioxoles.

35. A process as claimed in claim 27 wherein the organic semiconductor layer comprises a polyarylamine and has a mobility greater than $10^{-5}$ $cm^2V^{-1}s^{-1}$.

* * * * *